United States Patent

Nagata

Patent Number: 5,936,417
Date of Patent: Aug. 10, 1999

[54] TEST HEAD FOR IC TESTER

[75] Inventor: Takahiro Nagata, Tokyo, Japan

[73] Assignee: Ando Electric Co., Ltd., Tokyo, Japan

[21] Appl. No.: 08/914,722

[22] Filed: Aug. 19, 1997

[30] Foreign Application Priority Data

Aug. 23, 1996 [JP] Japan .................................... 8-241152

[51] Int. Cl.⁶ ............................. G01R 31/26; H01L 21/66
[52] U.S. Cl. ............................................ 324/754; 324/537
[58] Field of Search .................................. 324/500, 512, 324/527, 537, 763, 754, 538

[56] References Cited

U.S. PATENT DOCUMENTS

| | | | |
|---|---|---|---|
| 4,517,512 | 5/1985 | Petrich et al. | 324/537 |
| 4,862,075 | 8/1989 | Choi et al. | 324/754 |
| 5,101,153 | 3/1992 | Morong, III | 324/754 |
| 5,216,361 | 6/1993 | Akar et al. | 324/754 |
| 5,635,846 | 6/1997 | Beaman et al. | 324/754 |

*Primary Examiner*—Josie Ballato
*Assistant Examiner*—Jermele M. Hollington
*Attorney, Agent, or Firm*—Flynn, Thiel, Boutell & Tanis, P.C.

[57] ABSTRACT

To provide a test head for an IC tester wherein identical test signals can be distributed to a plurality of devices to be tested while holding in check an increase in the number of signal lines connecting a waveform shaper to the test head, upsizing of the test head, and an increase in power consumption. A plurality of pin-electronics-cards are connected with each other via a printed wiring pattern on a back board provided inside a test head, a waveform signal shaped at a waveform shaper is received by a receiver card provided in the test head and the waveform signal delivered from the receiver card is distributed to the plurality of the pin-electronics-cards via the printed wiring pattern provided on the back board while the end of the printed wiring pattern is terminated at the termination card.

11 Claims, 2 Drawing Sheets

TEST HEAD FOR IC TESTER

BACKGROUND OF THE INVENTION

1. Field of the Invention

The present invention relates to a test head for an IC tester, capable of distributing waveform signals to a plurality of devices arranged in parallel without use of a distribution circuit at a measurement test run by use of the IC tester on the plurality of the devices arranged in parallel.

2. Prior Art

FIGS. 2 and 3 are schematic representations illustrating the constitutions of conventional test heads for an IC tester, respectively, for use at a test run on a plurality of devices arranged in parallel.

Firstly, referring to FIG. 2, one of the test heads for the IC tester is described hereafter. The test head 1 in FIG. 2 is provided with a back board 3, with which a plurality of pin-electronics-cards 2 are linked so as to be electrically connected thereto.

The pin-electronics-cards 2 are connected to both the devices under test (hereinafter referred to as DUTs) not shown and the waveform shaper so as to be able to send test signals to DUTs.

Further, the back board 3 is constituted such that a waveform signal shaped at a waveform shaper 4 is split into a plurality of signals via a distribution circuit (not shown) and such signals are fed to the back board 3.

Application of a test signal in an identical waveform to each of the eight DUTs suffices for running a measurement test on, for example, eight DUTs arranged in parallel with use of the single test head 1 constituted as described above. Accordingly, the waveform signal shaped at the waveform shaper 4 is split into eight identical signals through a distribution circuit provided at the outlet of the waveform shaper 4, and then the eight signals are sent to the pin-electronics-cards 2 housed in the test head 1 via the back board 3.

In the case of the test head for the IC tester as shown in FIG. 2, there arises a problem of the need for providing numerous signal lines for connecting the waveform shaper 4 to the test head 1.

Hence, in order to solve such a problem as described in the foregoing, another test head for the IC tester, as shown in FIG. 3, has been proposed. Now referring to FIG. 3, parts corresponding to same in FIG. 2 are denoted by like reference numerals. In addition to the constitution of the test head 1 as shown in FIG. 2, a buffer board 8 is provided inside the test head 1, and a distribution circuit is provided on the buffer board 8 such that the waveform signal shaped at the waveform shaper 4 is split through the distribution circuit of the buffer board 8.

Further, branch cards 7 are interposed between the buffer board 8 and the back board 3. In other respects, the constitution of the test head 1 is the same as that in FIG. 2.

Similarly to the case of the test head shown in FIG. 2, application of a test signal in an identical waveform to each of the eight DUTs suffices for running a measurement test on eight DUTs arranged in parallel with use of the test head for the IC tester shown in FIG. 3. Accordingly, the waveform signal shaped at the waveform shaper 4 is received by the buffer board 8, split into eight identical signals through a distribution circuit provided on the buffer board 8, and then the eight signals are delivered to the pin-electronics-cards 2 via the branch cards 7.

SUMMARY OF THE INVENTION

With the test head for the IC tester as shown in FIG. 3, the problem of the need for providing numerous signal lines, as described in the case of the test head shown in FIG. 2, has been overcome. However, since the distribution circuit for test signals needs to be provided inside the test head in this case, other problems such as upsizing of the test head 1, and an increase in power consumption of the test head 1 have emerged.

In order to solve the aforesaid problems, a test head for an IC tester according to the present invention is provided with pin-electronics-cards 2 disposed inside the test head 1 and connected to both devices under test and a waveform shaper 4, for sending test signals to the devices under test. The waveform shaper 4 supplies waveform signals to the pin-electronics-cards 2. A back board 3 disposed inside the test head 1 delivers the waveform signals to the pin-electronics-cards 2 via a printed wiring pattern, a receiver card 5 receives the waveform signal shaped at the waveform shaper 4, and a termination card 6 terminates output signals from the receiver card 5 at the end of the printed wiring pattern provided on the back board 3.

DETAILED DESCRIPTION OF THE PREFERRED EMBODIMENTS

Figure 1:
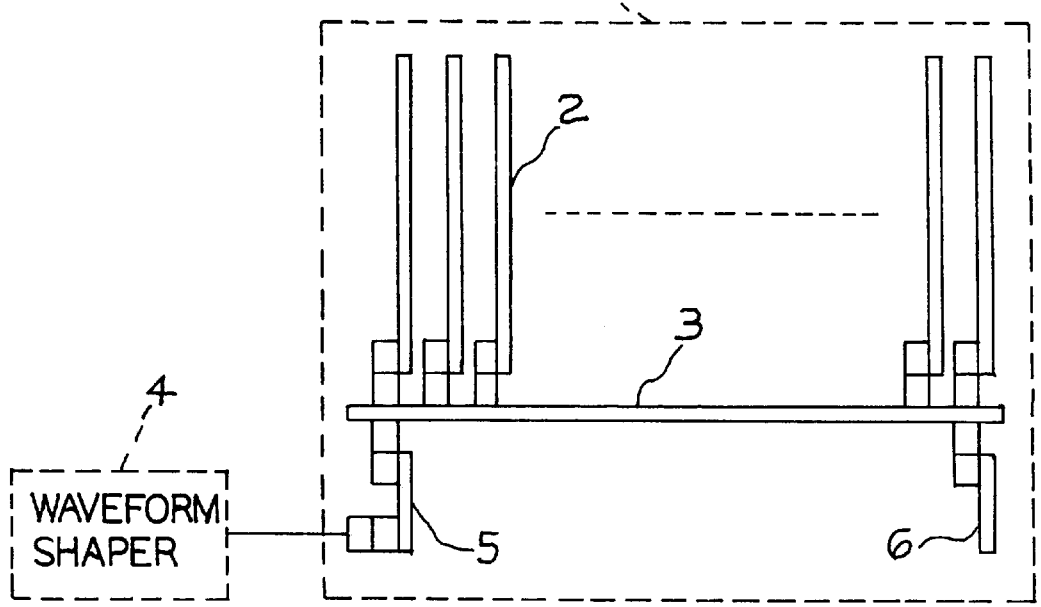
FIG. 1 is a schematic representation illustrating the constitution of a test head for an IC tester according to an embodiment of the invention.

With a test head for an IC tester according to an embodiment of the invention, when supplying a waveform signal shaped at a waveform shaper 4 to a plurality of pin-electronics-cards 2, the waveform signal shaped at the waveform shaper 4 is received by a receiver card 5, and output of the receiver card 5 is fed to the plurality of the pin-electronics-cards 2 via a printed wiring pattern provided on a back board 3 while the end of the printed wiring pattern on the back board 3 is terminated at a termination card 6.

Figure 2:
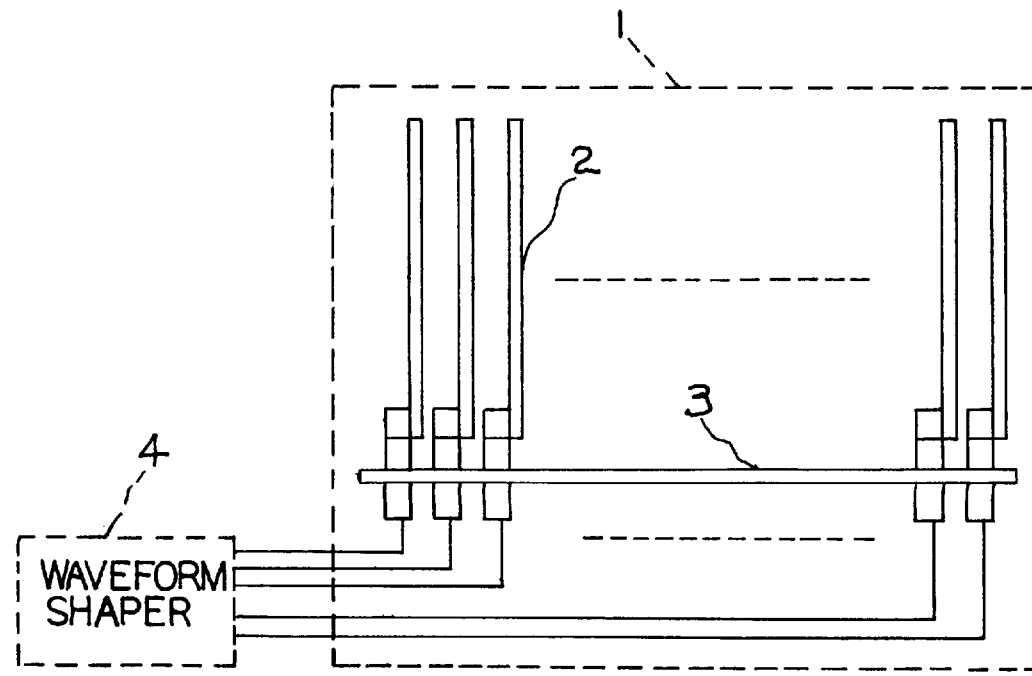
FIG. 2 is a schematic representation illustrating the constitution of an example of a conventional test head for an IC tester.
Figure 3:
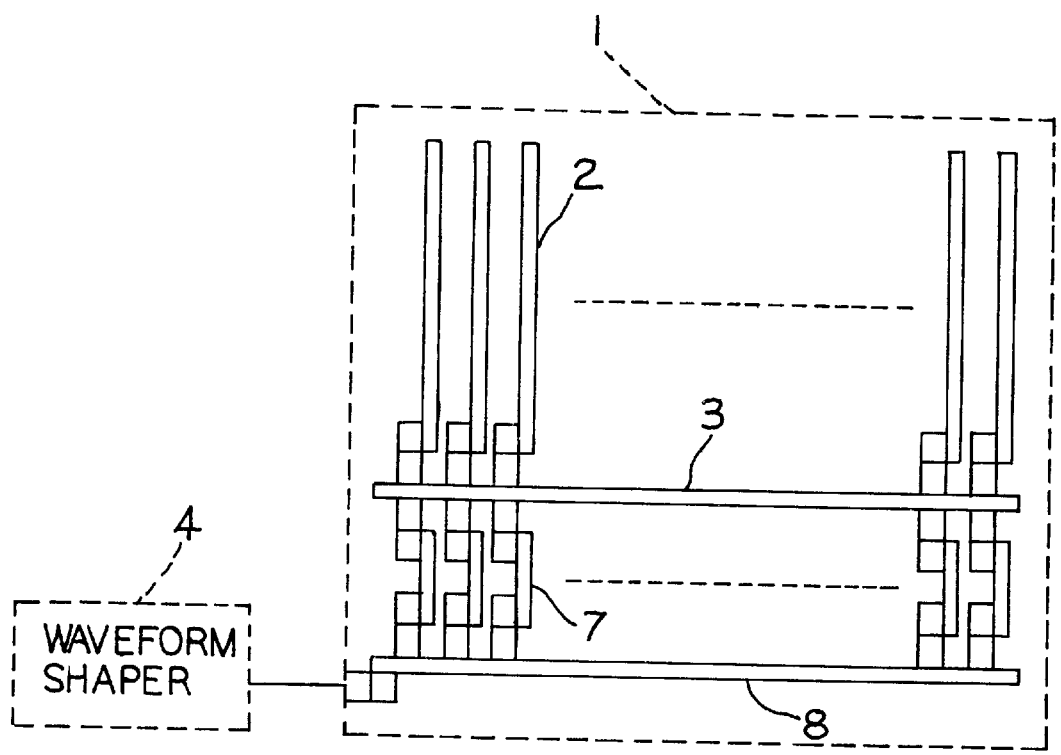
FIG. 3 is a schematic representation illustrating the constitution of another example of a conventional test head for the IC tester.

Referring now to the accompanying drawings, the test head for the IC tester according to the embodiment of the invention is described in detail hereafter. FIG. 1 is a schematic representation illustrating the composition of the embodiment of the invention. In FIG. 1, parts corresponding to same in FIGS. 2 and 3 are denoted by like reference numerals.

As shown in FIG. 1, the test head 1 is constituted such that the waveform signal shaped at the waveform shaper 4 is supplied to the plurality of the pin-electronics-cards 2 via the printed wiring pattern (not shown) on the back board 3.

The pin-electronics-cards 2 are connected to both DUTs and the waveform shaper 4 in FIG. 1, so that the waveform signals originated from the waveform shaper 4 are supplied as test signals to the DUTs. The receiver card 5 and the termination card 6 are disposed on the underside of the back board 3 provided inside the test head 1.

The receiver card 5 is connected to both the waveform shaper 4 and the back board 3 so as to receive the waveform signal shaped at the waveform shaper 4 so that output of the receiver card 5 is sent to the plurality of the pin-electronics-cards 2 in the form of waveform signals via the printed wiring pattern provided on the back board 3.

The termination card 6 terminates the end of the printed wiring pattern on the back board 3 so that the waveform signals delivered from the receiver card 5 are terminated at the end of the printed wiring pattern.

Now the operation of the test head shown in FIG. 1 is described. In the case of running a measurement test on, for example, eight DUTs arranged in parallel with use of the single test head 1 constituted as described above, application of a test signal in an identical waveform to each of the eight DUTs suffices to attain the purpose. Accordingly, the waveform signal shaped at the waveform shaper 4 is split into eight identical signals by causing the receiver card 5 inside the test head 1 to receive the waveform signal shaped at the waveform shaper 4, and supplying output from the receiver card 5 to the printed wiring pattern on the back board 3 so that the eight pin-electronics-cards 2 can receive the eight waveform signals, respectively, from the back board 3. The end of the printed wiring pattern on the back board 3 is terminated at the termination card 6.

In the case of the embodiment of the invention shown in FIG. 1, the waveform signal originated from the waveform shaper 4 is received once by the receiver card 5, and then supplied to the printed wiring pattern on the back board 3. However, in case that no risk of degradation in the waveform of the waveform signal from the waveform shaper 4 is anticipated, output signal from the waveform shaper 4 may be directly supplied to the printed wiring pattern on the back board 3.

Also, in the case of the embodiment of the invention shown in FIG. 1, the waveform signals are terminated by the termination card 6. However, the waveform signals may be terminated by a termination resistor provided on the back board 3.

In running a measurement test on the plurality of DUTs with use of the test head for the IC tester according to the invention, the waveform signal shaped at the waveform shaper is supplied to the plurality of the pin-electronics-cards via the printed wiring pattern on the back board disposed in the test head. Consequently, the distribution circuit for splitting the waveform signal originating from the waveform shaper is no longer required, and the waveform signals can be distributed without increasing the number of signal lines between the waveform shaper and the test head while holding in check the upsizing of the test head and an increase in power consumption.

I claim:

1. An IC tester comprising:
    a plurality of pin-electronics-cards provided inside a test head and connected to devices to be tested;
    a waveform shaper outside of the test head for supplying waveform signals to the pin-electronics-cards;
    a receiver card inside the test head for receiving the waveform signals shaped at the waveform shaper;
    a single signal line connecting the waveform shaper to the receiver card;
    a back board provided inside the test head for receiving the waveform signals from the receiver card and supplying the waveform signals from the receiver card to the pin-electronics-cards via a printed wiring pattern; and
    a termination card at an end of the printed wiring pattern provided on the back board for terminating the waveform signals originating from the receiver card.

2. An IC tester comprising:
    a waveform shaper for supplying shaped waveform signals; and
    a test head including:
        (a) a receiver card for receiving the waveform signals from the waveform shaper, the waveform shaper being located outside of the test head, the receiver card outputting a plurality of the waveform signals;
        (b) a back board having a printed wiring pattern thereon, the back board receiving the plurality of the waveform signals at the printed wiring pattern thereon, and the receiver card being secured to a first end of the back board; and
        (c) a plurality of pin-electronics-cards connected to the printed wiring pattern on the back board so that each pin-electronics-card receives one of the plurality of the waveform signals from the wiring pattern on the back board, each of the pin-electronics-cards being connected to a device to be tested to apply the respective waveform signal thereto.

3. The IC tester of claim 2, wherein the plurality of waveform signals comprise eight waveform signals carried by the back board to eight of the pin-electronics-cards.

4. The IC tester of claim 2, wherein a single signal line connects the waveform shaper to the receiver card.

5. The IC tester of claim 2, wherein the receiver card is configured to prevent degradation of the waveform signals received from the waveform shaper.

6. The IC tester of claim 2, wherein the test head includes a termination card secured to the back board at a second end thereof for terminating the waveform signals.

7. The IC tester of claim 2, wherein the test head includes a termination resistor for terminating the waveform signals.

8. An IC tester comprising:
    a waveform shaper for supplying shaped waveform signals; and
    a test head including:
        (a) a back board provided having a printed wiring pattern thereon for receiving the waveform signals from the waveform shaper;
        (b) a plurality of pin-electronics-cards connected to the printed wiring pattern of the back board so that each of the pin-electronics-cards receives one of the multiple waveform signals from the wiring pattern, each of the pin-electronics-cards being connected to a device to be tested to apply the respective waveform signal thereto; and
        (c) a termination card secured to the back board for terminating the waveform signals to prevent reflections of the waveform signals from interfering with testing of the devices.

9. The IC tester of claim 8, wherein a single signal line connects the waveform shaper to the printed wiring pattern of the back board.

10. The IC tester of claim 8, wherein the printed wiring pattern of the back board carries the waveform signals on eight different paths to the plurality of pin-electronics-cards.

11. The IC tester of claim 8, wherein the waveform shaper is outside of the test head.

* * * * *